United States Patent
Hertz et al.

[11] Patent Number: 6,138,562
[45] Date of Patent: Oct. 31, 2000

[54] VIBRATIONAL ENERGY WAVES FOR ASSIST IN THE PRINT RELEASE PROCESS FOR SCREEN PRINTING

[76] Inventors: Allen D. Hertz; Eric L. Hertz, both of 12784 Tulipwood Cir., Boca Raton, Fla. 33428; Dennis D. Epp, 171 Stonecliffe Aisle, Irvine, Calif. 92612

[21] Appl. No.: 09/208,959

[22] Filed: Dec. 10, 1998

Related U.S. Application Data

[60] Provisional application No. 60/071,866, Jan. 20, 1998.
[51] Int. Cl.[7] .............................. B41F 15/12; B41M 1/12
[52] U.S. Cl. ........................................... 101/129; 101/114
[58] Field of Search .................................. 101/114, 126, 101/127.1, 128.1, 129; 427/96

[56] References Cited

U.S. PATENT DOCUMENTS

| | | | |
|---|---|---|---|
| 4,604,966 | 8/1986 | Kohn ........................................ | 101/120 |
| 5,356,658 | 10/1994 | Hertz et al. ............................... | 427/96 |
| 5,395,040 | 3/1995 | Holzmann ................................ | 228/254 |
| 5,407,488 | 4/1995 | Ray ........................................... | 134/6 |
| 5,431,332 | 7/1995 | Kirby et al. .............................. | 427/282 |
| 5,742,886 | 4/1998 | Snelling et al. .......................... | 399/296 |
| 5,878,661 | 3/1999 | Glovatsky et al. ...................... | 101/127 |

FOREIGN PATENT DOCUMENTS

| | | |
|---|---|---|
| 5047 | 1/1992 | Japan . |
| 35090 | 2/1992 | Japan . |
| 246005 | 9/1993 | Japan . |
| 106705 | 4/1994 | Japan . |

*Primary Examiner*—Stephen R. Funk

[57] ABSTRACT

Solder Paste, adhesives and other materials are screen printed onto Printed Circuit Boards (PCB's) during the assembly process for electronic circuit assemblies. Pressure forces may be applied to the material to aid in separating the material from the apertures within the stencil. The pressure forces are created from sound pressure waves generated from a vibrational energy source located some distance from the stencil. Examples of non-contacting vibrational energy sources include Ultrasonic transducers, horns, speakers, and tuning forks. Additional assistance to separate the material from the apertures may be applied by a vibrational source by contacting to the stencil. Examples of the contacting vibrational energy sources may be off-balanced motors, piezoelectric transducers, and mass-resonant vibrators.

23 Claims, 11 Drawing Sheets

VIBRATIONAL ENERGY WAVES FOR ASSIST IN THE PRINT RELEASE PROCESS FOR SCREEN PRINTING

This patent application claims priority from U.S. Provisional Application No. 60/071,866, filed Jan. 20, 1998, entitled Vibrational Energy for Improved Soldering of Printed Circuit Assemblies.

FIELD OF THE INVENTION

This invention relates in general to the field of screen printing, and in particular to a method and apparatus for screen printing of electrical and electronic assemblies.

BACKGROUND OF THE INVENTION

Screen printing is a well established method of transferring a fluidized or other media into a pattern on the surface of an object. Screen printing is applied in many forms of manufacturing, ranging from the printing of inks on cloth, such as T-shirts, to printing of solder paste and adhesives onto printed circuit boards (PCBs) for the assembly of electronic products. A wide variety of equipment and tooling may be used for a wide range of screen printing applications. As particularly described in this application for exemplary purposes only, screen printing is used in the manufacture of PCBs, which are sometimes also referred to as printed circuit assemblies (PCAs). As shown in FIGS. 1A and 1B and generally known in the art, the components 3 that are attached to and perform the operational functions of a PCA 1, are attached to a substrate 2. One of the most common ways to attach the components 3 is to place a series of solder paste deposits 7 directly on the substrate 2 or on a pad 5 attached to the substrate 2. The pads 5 may connect to leads 8 on the substrate 2. After the components 3 or component leads 6 are placed into the paste deposits 7, the assembly 1 may be heated above the liquidus temperature of the solder, causing the solder paste deposits 7 to flow and join the components 3 to the pads 5 on the substrate 2.

As is further known in the art and generally illustrated in FIG. 1, the components 3 to be attached to the substrate 2 are very small and getting smaller. Generally, the steps used in the process are known in the art, as described below.

A stencil (also referred to as a screen) is created with an aperture or a plurality of apertures defining a pattern that is to be 'printed' onto a surface. The stencil is placed onto the surface upon which a material is to be deposited in a pattern. The material may be in a liquid or solid or solid/liquid composition. In the case of the preferred embodiment, the material that is to be deposited comprises fine particles of solder powder mixed into flux.

The stencil is generally placed substantially parallel to the surface and may contact the surface. The aperture or apertures are aligned on the surface to create the desired pattern. For gravity-driven printing, the stencil is generally placed on top of the surface. The material to be deposited is then placed on top of the stencil for deposition into the aperture or apertures. Various methods may be used to move the material from the top of the stencil and place the material into the aperture or apertures, as are generally known in the art. For example, squeegees are often used in various ways to move material into the aperture or apertures. Once the apertures are filled with material, excess material may be removed from the top of the stencil so that substantially all of the material that remains proximate the stencil is in the aperture or apertures.

Lastly, the stencil is removed from its proximity to the surface of the substrate, leaving the material deposited on the surface of the substrate.

Various methods and equipment have been invented to automate the process described above, with many different approaches, as are known in the art. Many improvements in the art have resulted in an increase in the efficiency of the process. For example, machines have been invented to hold the stencil, align the stencil to the surface of the substrate, more accurately place and remove the material into the apertures, and to separate the stencil from the surface of the substrate. However, none of these has solved the problems that the present invention solves.

The screen printing process is made more difficult as the size of the apertures decreases and the size of the surface area on the objects decreases. This is particularly true in manufacturing electrical and electronic assemblies. One particular problem that the present invention solves is that the material that is to be deposited onto the surface tends to stick to the sides of the apertures in the stencil. This problem has two particular outcomes that the present invention solves. First, the deposited material may slump or otherwise move outside the area defined by the aperture after the stencil is removed. For electronic assemblies, this can have disastrous consequences and require rework of defects. Secondly, the shape of the remaining material may cause problems. Preferably, the material that is left on the surface will have a uniform surface defined by the stencil apertures, and the remaining top surface of the material will be substantially flat. For PCBs, the material that is deposited on the surface is generally referred to as a solder paste deposit. Uniformity is very important for deposits so as not to create an area of conductivity where that is not desired. Further, it is important that the deposit have a uniform top surface to enhance the attachment of electronic components.

FIGS. 2A, 2B, 2C, 2D and 3 are simple illustrations that show some of the basic steps in the process. FIG. 2A shows a three-dimensional view of a stencil 10 that has multiple apertures 11. FIG. 2B shows a single aperture 11 in the stencil 10 from a cut-away view, slightly above an object 12. FIG. 2C shows the stencil 10 of FIG. 2B after it has been placed on the object 12 and material 13 has been placed in the aperture 11. Finally, FIG. 2D shows the stencil 10 that has been lifted off the object 12, leaving behind the material 13. The vertical length of the sides 15 of the aperture 11 in each of FIGS. 2B, 2C and 2D are relatively small compared to the target area 14 of the object 12 defined by the aperture 11. From a 2-dimensional view, the relative size of the target area is shown by the measurement A. When the stencil 10 is removed after material 13 is placed in the aperture 11, gravity and surface effects cause some of the material 13 to stick to the target area 14. To a lesser extent, surface effects cause the material 13 to stick to the aperture sides 15. If the target area 14 is much larger than the sides 15 of the aperture 11, the effect of material 13 sticking to the sides 15 is of less practical concern.

However, FIG. 3 illustrates the problem presented when the sides 25 of the stencil 20 aperture 21 become relatively larger when compared to the target area 24 of the surface 26 of the object 22. (as above, the target area 24 is proportional to measurement B.) This potential problem is generally due to shrinkage in the size of the components to be mounted. Here, the surface effects of the material 23 contacting the sides 25 are relatively larger than the surface effects of the material 23 contacting the surface 26, resulting in a tendency for the material 23 to stick to the sides 25 of the aperture 21, causing a number of problems or potential problems. As mentioned earlier, the material 23 may slump and migrate outside the area defined by the aperture 21 causing conductivity problems. Further, the surface area of the resulting deposit 23 may not be uniform, potentially creating problems in attaching components.

The limitations of this process continue to be challenged as the apertures and the resulting deposit area decrease in size. There are factors other than geometry that may impact the release of the material. Examples include the shear to tact ratio of the material, the surface finish of the stencil, and the cross sectional geometry of the stencil aperture sides.

To date, attempts to solve the problem have focused on changing the stencil release speed, changing the surface finish of the stencil, and changing the cross-sectional geometry of the aperture using aperture sides that are non-vertical.

A first known approach is the use of a slow separation between the stencil and the surface. The slow separation utilizes gravity to assist in the release of the material by allowing the weight of the material to overcome the shear force at the interface between the material and the side wall of the stencil aperture. The major detriment of this approach is that it inherently makes the process take longer.

A second approach known to assist with release of the printable material is to modify the surface of the stencil and at least change the surface finish of the surface of the aperture sides. Two examples of this approach applied to metal stencils would be electropolishing and nickel plating the surface after creating the apertures. This approach helps the release, but may be expensive and ineffective.

A third known approach to assist with release of the printable material is to design the cross section of the aperture in a trapezoidal shape, where the area defined by the aperture at the surface of the object side is larger than the area defined by the aperture at the stencil top side.

Thus, what is desirable, is a means to increase the speed of release of the material without altering the geometry of the deposition, and increase the quality of the resulting material deposition.

SUMMARY OF THE INVENTION

One object of the present invention is to increase the speed of release of a material from a stencil and increase the quality of the resulting material deposition.

A second object of the present invention is to increase the repeatability and overall quality of release of a resulting deposition without deforming the deposition.

The invention comprises a method and apparatus used to apply a material in a pattern onto the surface of an object using a stencil having one or more apertures. The invention optimizes the release of the material from the apertures.

The present invention preferably uses equipment known in the art, including a stencil with at least one aperture, a means to align the stencil to a desired location on an object, a means to place material onto the stencil and into the apertures, a means to separate the stencil from the object, and a sound wave generator.

The invention includes an apparatus and a method for screen printing electrical and electronic assemblies. Use of the new apparatus and method improves release of material from the apertures of a stencil. The preferred method and apparatus disclose the application of sound waves or other vibrational energy to overcome the surface tensional forces and other forces that cause the material to stick to the stencil. The sound waves or other vibrational energy are preferably transferred to the stencil or to the material, to create shearing forces between the material and the aperture sides. The resulting shearing forces are generated by the variation in motion between the stencil and the material because of the differences between the natural frequencies and dampening forces of each. These shearing forces may allow the material to slide downward relative to the upward movement of the stencil, and allow the material to remain on the object, resulting in a uniform deposit at the desired location on the object. When sound pressure waves are used, they may apply additional pressure to the material within the apertures, whereby the pressure assists in separating the material from the aperture. Gravity and the tact forces between the object and the material will also aid in the complete transfer of the material from the aperture to the object.

The preferred means for creating and applying vibrational energy is to use sound waves, preferably with a small amplitude and a high frequency. This may result in an oscillation of the stencil perpendicular to the plane of the stencil and a vibration of the material. The vibrational energy preferably may be transferred from a speaker or horn to the material and the stencil through the air. Not only may the sound waves or other vibrational energy oscillate the stencil; the sound waves or other vibrational energy may also apply downward pressure to the material. Alternatively, the vibrational energy may be transferred from an offset motor, piezoelectric transducer, pancake motor, or any similar vibrational source that may be coupled to the foil of a stencil or transmitted through the air.

One advantage of transferring the vibrational energy either via pressure wave through air or via an attachment to the surface of the stencil is to ensure the oscillatory motion of the stencil material is primarily perpendicular to the plane of the stencil, and is directed at the material. Additionally, this method lessens the vibrational energy that is transmitted throughout the rest of the equipment. The vertical motion will lessen horizontal motion of the stencil. Horizontal motion of the stencil may cause the material deposition to slump or otherwise to alter the preferred geometry.

Vibrational energy may alternatively be applied to the object. However, applying the vibrational energy to the object may cause the object to move horizontally thereby possibly affecting the resulting geometry of the material deposition detrimentally. The preferred result is a repeatable deposition of material with a minimal volume of material remaining within the apertures of the stencil. This is particularly useful where the surface area of the sides of the stencil apertures is relatively large compared to the area of the cross sectional opening of the aperture.

DETAILED DESCRIPTION OF THE INVENTION

Figure 2A:
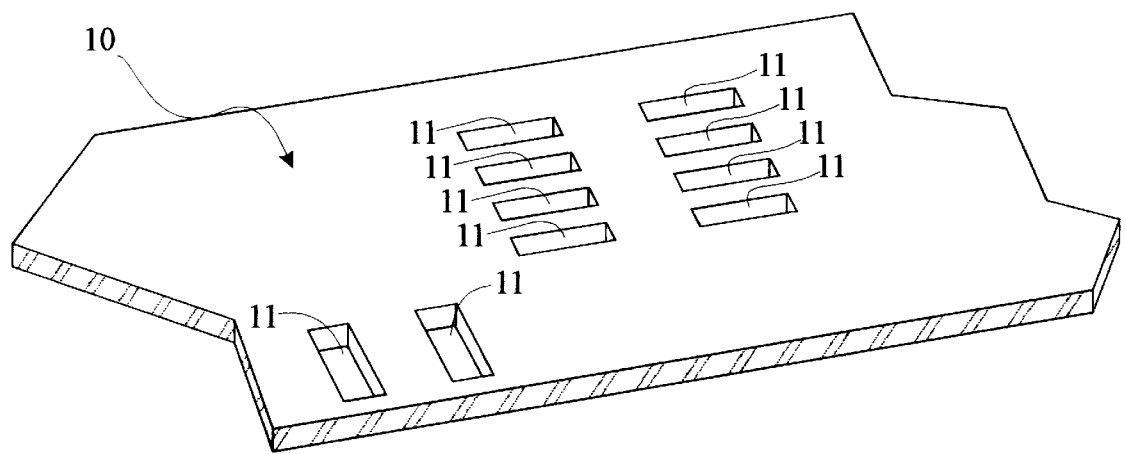
FIG. 2A is a perspective, three-dimensional view of a stencil that has apertures and that may be used for solder paste deposits.
Figure 2B:
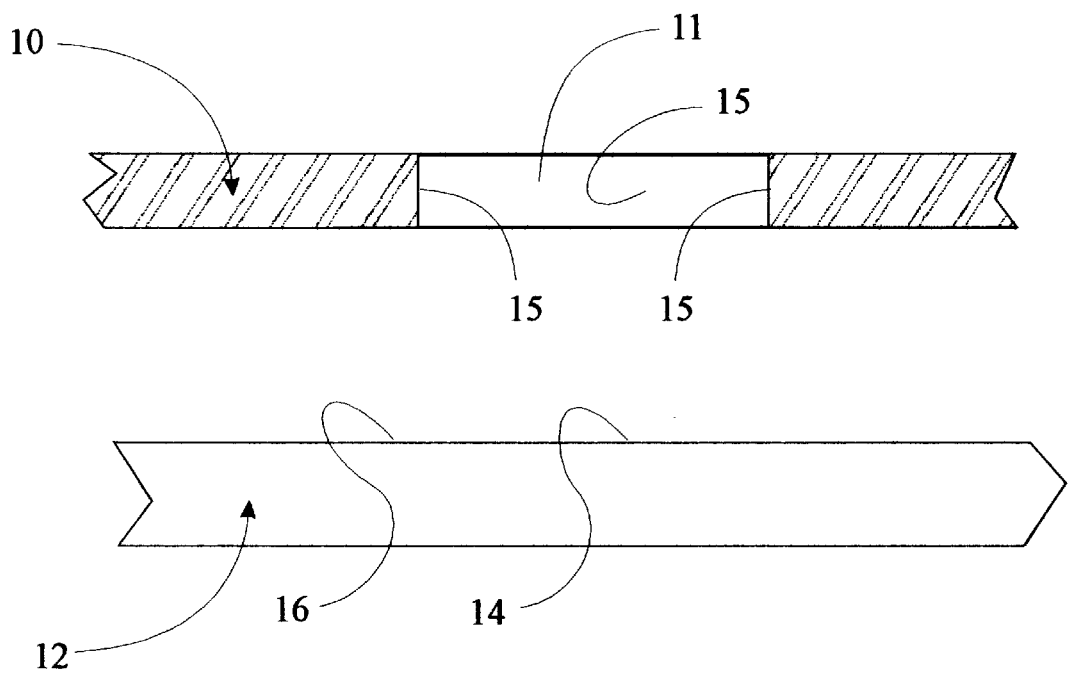
FIG. 2B is a cut-away, two-dimensional view of a stencil showing the interior of a single aperture that is placed proximate an object but has not yet been placed upon the object.
Figure 2C:
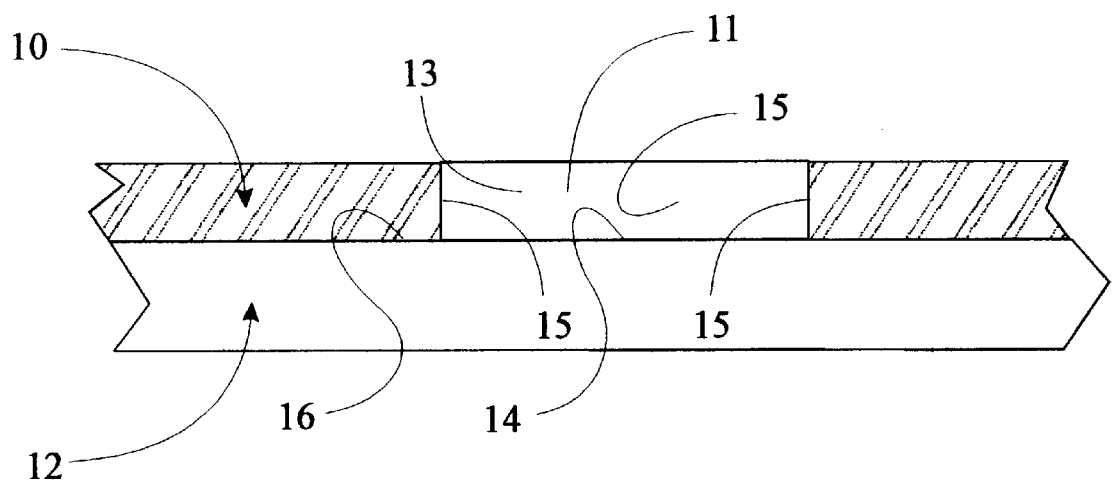
FIG. 2C is a cut-away, two-dimensional view of the stencil of FIG. 2B that has been placed upon the object of FIG. 2B, and shows that material has been deposited into the single aperture shown.
Figure 2D:
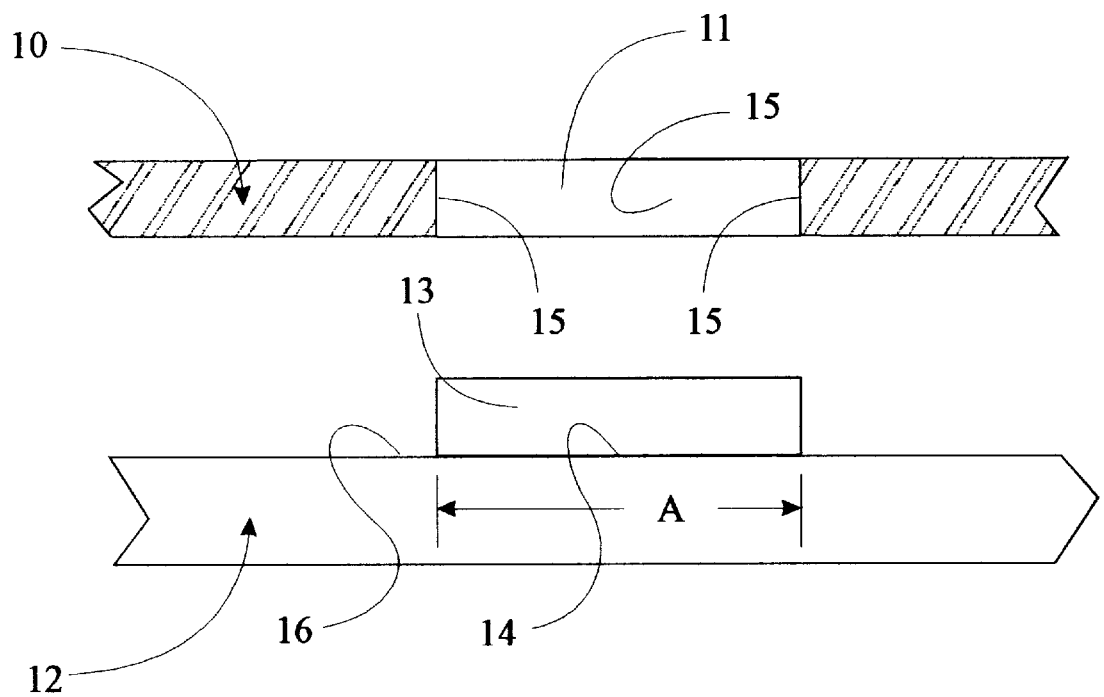
FIG. 2D is a cut-away, two-dimensional view of the stencil of FIG. 2C where the stencil has been lifted off of the object of FIG. 2C, and shows that material that was placed in the aperture has remained on the object.
Figure 3:
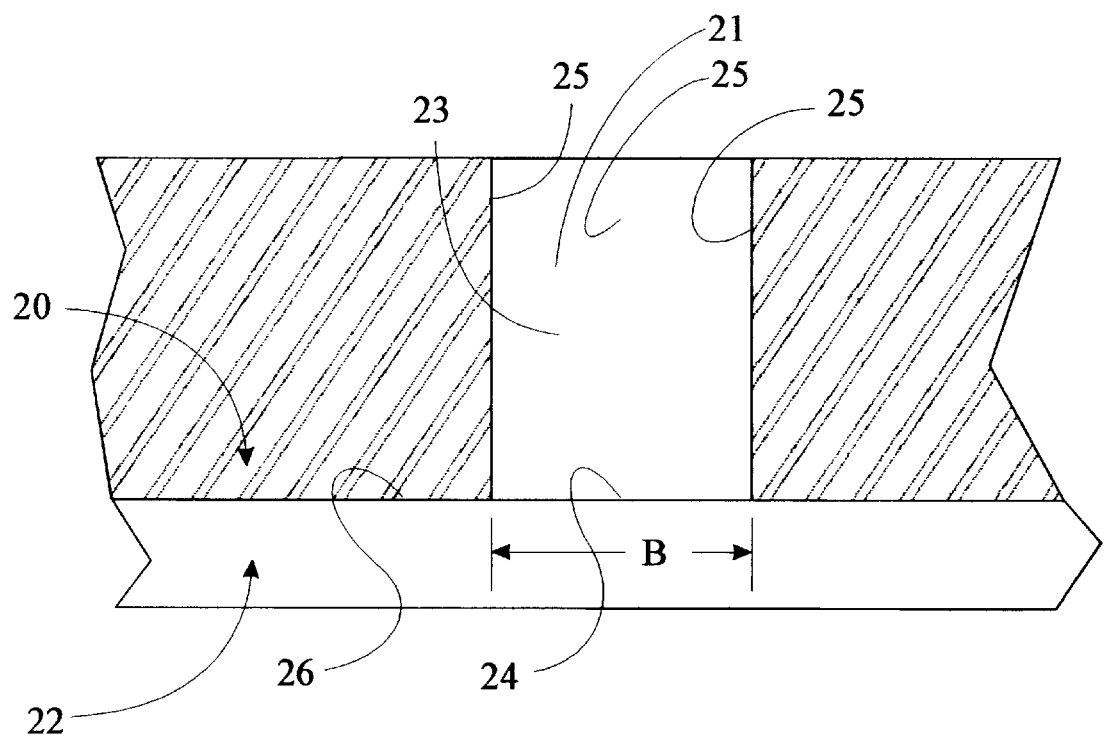
FIG. 3 is a cut-away, two-dimensional view of a stencil showing a single aperture that has relatively taller sides than the area defined by the aperture, and shows that material has been deposited into the single aperture shown (similar to FIG. 2C).
Figure 4:
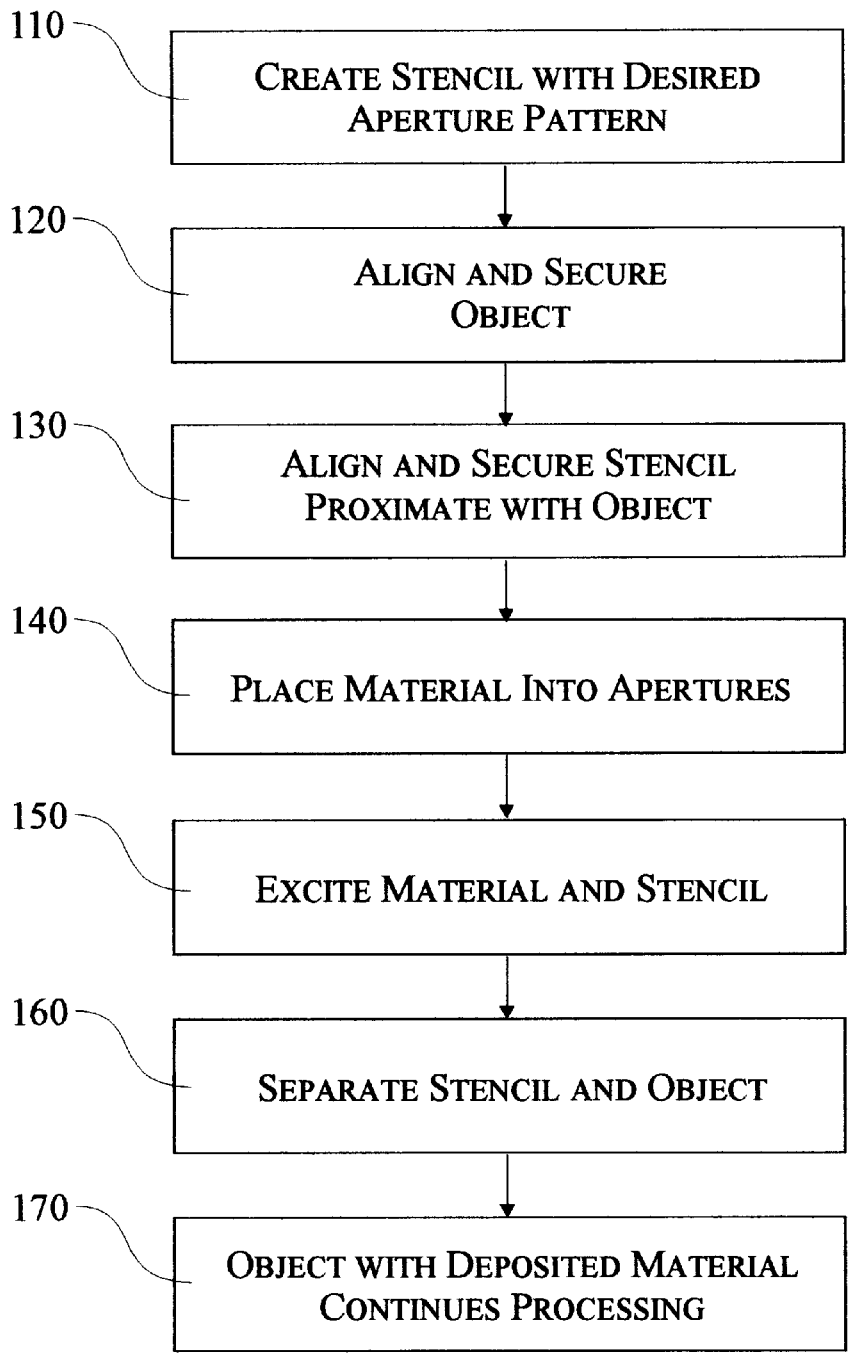
FIG. 4 is a flow diagram showing the process steps of the present invention.

FIG. 4 is a flow diagram showing the preferred screen printing process steps of the present invention. FIGS. 2B, 2C and 2D illustrate some of the steps in the process. The first step 110 is the fabrication of a screen or stencil 10. A stencil 10 is a sheet like device created by fashioning apertures 11 into a foil. Stencils 10 may be fabricated using many methods that are known in the art, including but not limited to, precision milling of a raw foil preferably using a programmable computer controlled mill, chemically etching using photodeveloped or equivalent masking images on a raw foil and applying a predetermined chemical which will corrosively remove the exposed portions of the foil, an additive process which uses a negative pattern and bonds particles of metal around the pattern to form a foil, or laser cutting using a programmable, focused laser beam to cut through the foil.

The second step 120 in the preferred screen printing process is to align an object 12 in a manner to support and secure the object 12. The object 12 may be secured to a mechanism to reduce horizontal or vertical movement during the deposition process.

The third step 130 is to align the stencil 10 proximate the object 12. The stencil 10 preferably is aligned so that the pattern of apertures 11 defined by the stencil 10 are arranged to leave the desired deposits 13 in the desired location, the target area 14. The stencil 10 is affixed to the object 12 via a mounting mechanism by means known in the art.

The fourth step 140 is to place material 13 into the apertures 11. The material 13, is preferably placed into the apertures 11 by means known in the art. It is known in the art to place a quantity of material 13 onto the stencil 10 and use a squeegee to move the material 13 into the apertures 11.

The fifth step 150 is to excite the material 13 and the stencil 10 via the application of vibrational energy. Preferably, vibrational energy is created and transferred through the air using a transducer 31 such as speaker or horn (see FIG. 7) located above and proximate the stencil 10. This can be applied prior to and/or during the succeeding step. Alternatively, the vibrational energy may be created via a vibration source 33 (see FIG. 7) coupled directly to the stencil 10.

The sixth step 160 of the preferred process is to separate the stencil 10 and the object 12.

The seventh and final step 170 of the preferred process is to remove the object 12 from the mounting mechanism and continue processing.

Figure 1A:
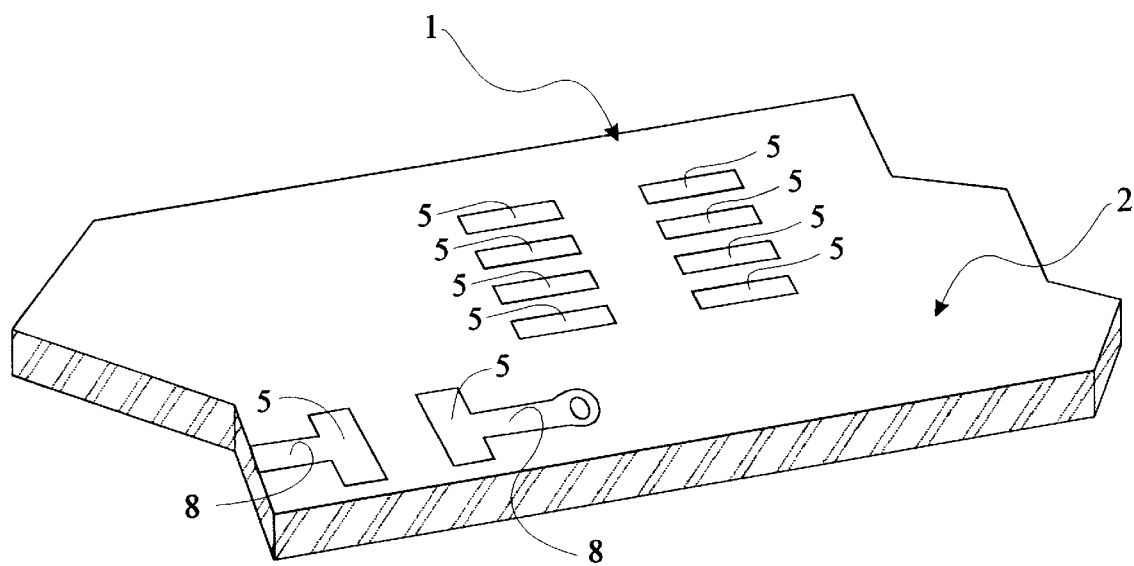
FIG. 1A is a perspective view of a substrate having pads and traces, said pads for receiving solder paste deposits.
Figure 1B:
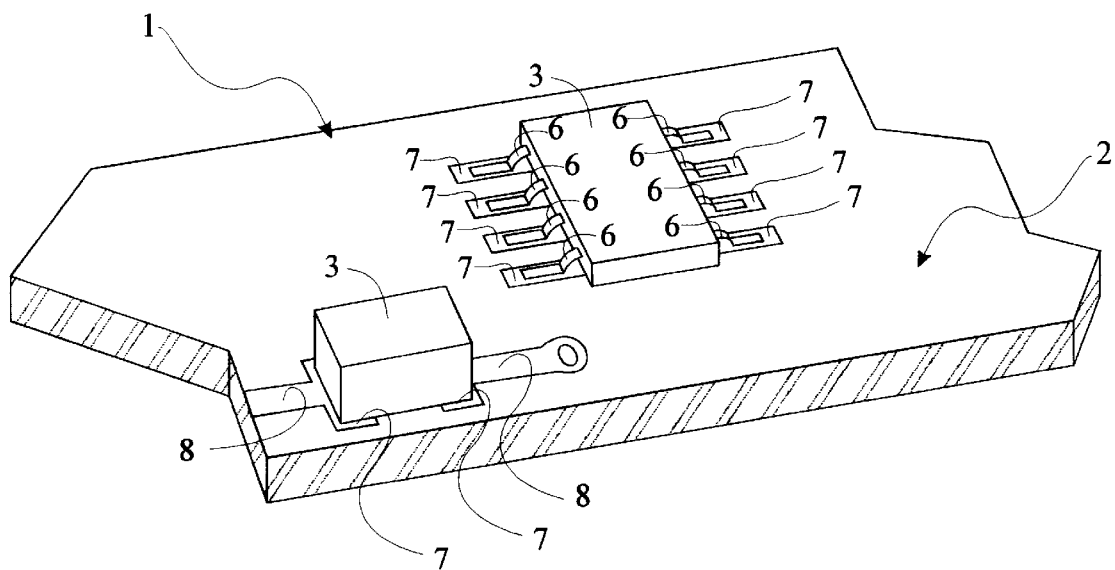
FIG. 1B is a perspective view of a substrate having pads and traces, and also having attached electrical components.
Figure 5:
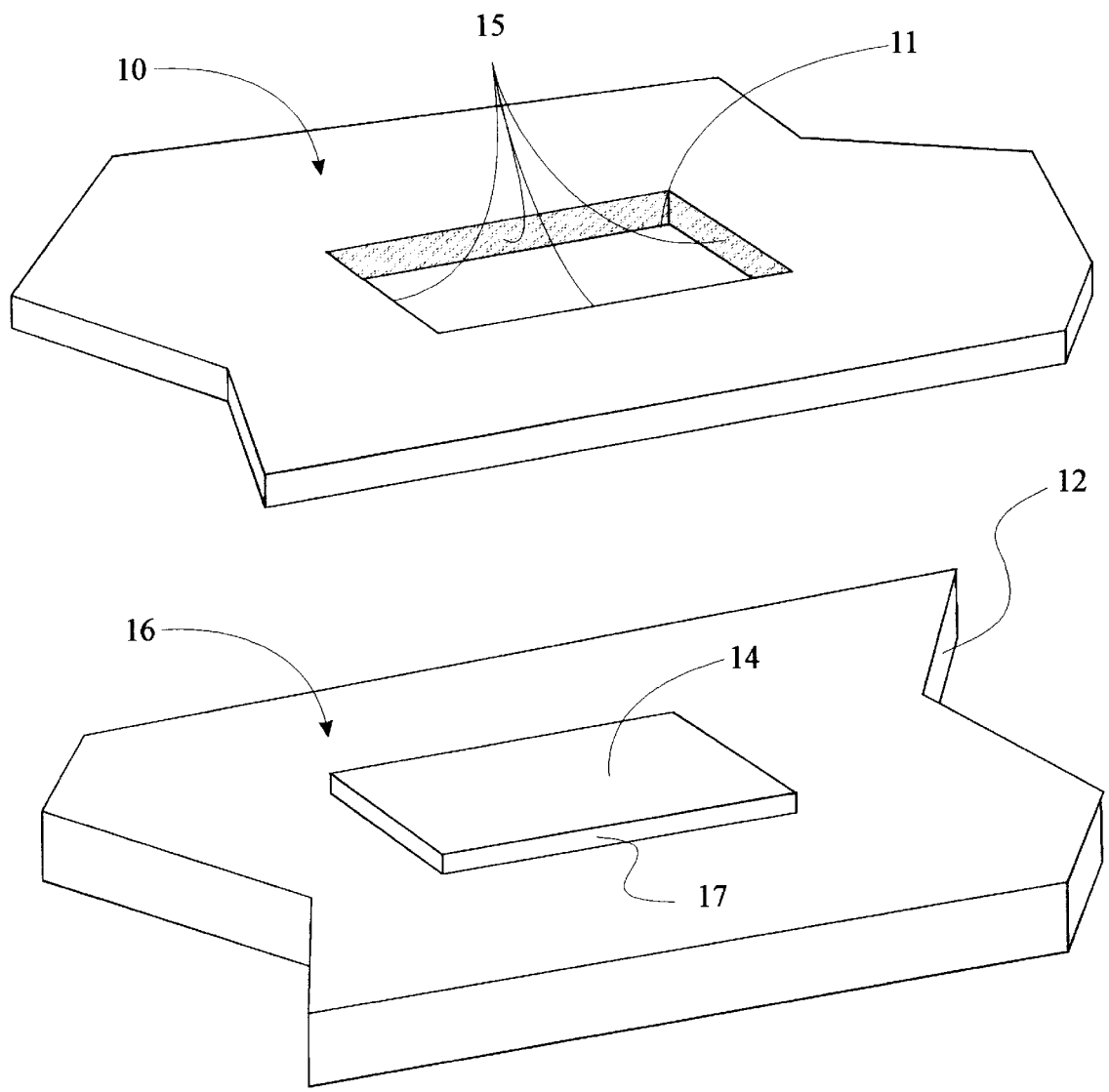
FIG. 5 is a perspective view of a stencil showing a single aperture above an object and the desirable location for deposition of a material.

FIG. 5 illustrates a perspective view of the preferred stencil 10 including one aperture 11. Most stencils have a plurality of apertures 11, but one is all that is necessary to describe the invention claimed herein. FIG. 5 also depicts an object 12 for receiving a material deposit. The object 12 preferably is a substrate used for mounting various electrical and electronic components to create a printed circuit assembly (PCA), as illustrated in FIGS. 1A and 1B. The substrate 12 preferably has an upper surface 16, upon which are placed the various components and the material deposit 13. The substrate 12 is preferably formed of epoxy glass or other materials known in the art. The substrate 12 may have a pad 17 or a plurality of pads 17 located on a surface 16. Alternatively, in the absence of a pad or pads, the substrate 12 may have a target area 14 that defines the area upon which the material 13 is to be deposited.

The stencil 10 shown in FIG. 5 shows an aperture 11 defined by four sides 15. The aperture 11 may alternatively be a variety of shapes, defined by the side or sides 15 of the apertures 11. The side(s) 15 may be shaped vertically with respect to the surface 16 of the object 12, or a variety of different shapes. For example, the sides 15 of the apertures 11 are sometimes trapezoidally-shaped to aid in the release of the material 13. This is one way known in the art to aid in the release of the material 13 from the sides 15 of the aperture 11.

The geometry of the sides 15 of the aperture 11 and the relative size of the aperture 11 may affect the release of the material from the sides 15. Generally, as the size of the aperture 11 gets smaller, and the relative height of the sides 15 gets bigger, the problem of the material 13 sticking to the sides 15 increases. There are other factors that contribute to the transfer of the material from the aperture 11 to the object 12. These include but are not limited to: the horizontal geometry of the aperture 11, the cross sectional geometry of the aperture 11, the microfinish of the sides 15 of the aperture 11, and the shearing properties and tact properties of the material 13.

Figure 6:
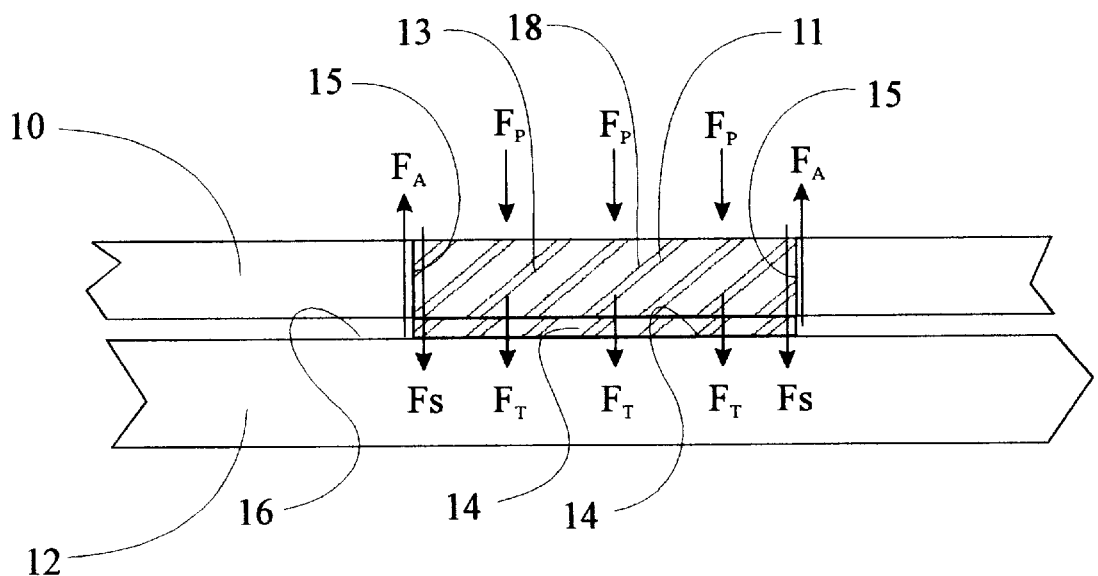
FIG. 6 is a cut-away, cross-sectional view that illustrates the forces exerted on the material during the preferred process to separate a stencil and an object.

FIG. 6 is a cross-sectional drawing of a portion of the stencil 10 located proximate to and aligned to the object 12, as described in step 130 of FIG. 4. The aperture 11 is aligned to the desired target area 14 on the surface 16 of the object 12. In this case, a solder pad 17 is located on the object (or substrate) 12. Material 13 is wiped across and into the apertures 11 using a squeegee. When the stencil 10 is moved relative to the object 12, either by moving the object 12 away from the stencil 10 or by moving the stencil 10 away from the object 12 or both, a number of forces are created. The primary force that makes the material stick to the pad 17 on the surface 16 is the tact force ($F_T$) created at the interface between the material 13 and the pad 17. The primary force that causes the material 13 to resist release from the aperture 11 is the tact force ($F_A$) at the interface between the material 13 and the sides 15 of the aperture 11, which induces a shearing force ($F_S$) within the material 13.

The present invention preferably introduces vibrational energy to counteract the forces ($F_A$) opposing separation of the stencil 10 and the material 13. The vibrational energy may result in motion of the stencil 10 and the material 13. An added benefit of the preferred embodiment is the introduction of a downward pressure, resulting in a downward force ($F_P$) on the material 13, which aids in overcoming the tact forces ($F_A$).

Figure 7:
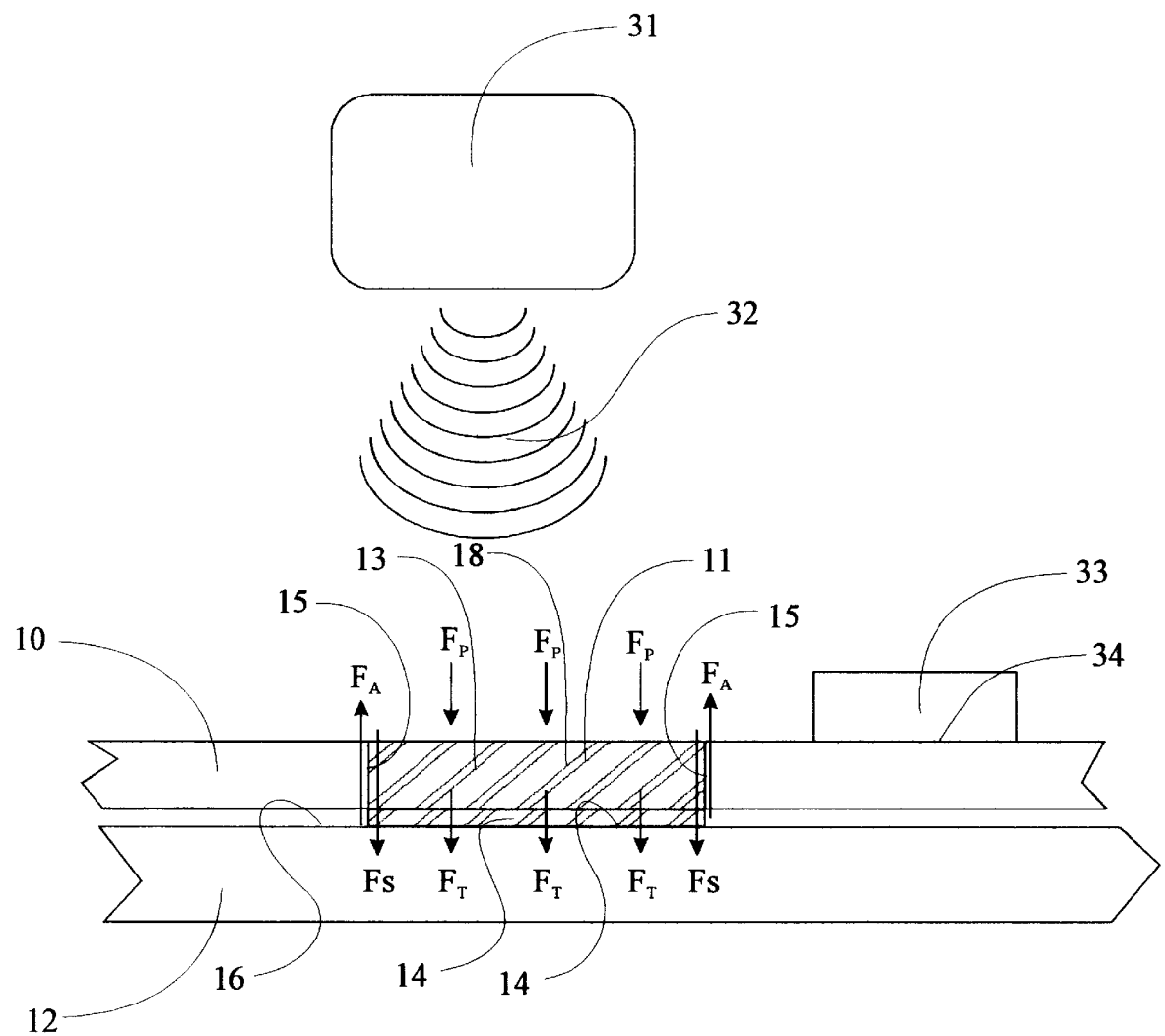
FIG. 7 is a cut-away, cross-sectional view that illustrates two preferred methods of transferring the vibrational forces to the material and stencil.

FIG. 7 is a cross-sectional drawing illustrating two preferred methods to transfer vibrational energy to the stencil 10 and the material 13, resulting in a vibrational motion and a pressure ($F_P$) applied to the material 13 and possibly the stencil 10 and the object 12. The vibrational energy preferably originates from a transducer 31 which transmits vibrational energy 32 through the air to the stencil 10 and the material 13. The transducer 31 is preferably an ultrasonic horn that transmits sound waves 32 of small amplitude and high frequency. Alternatively, the preferred transducer 31 may be, for example, a tuning fork or speaker. The sound pressure waves 32 transmitted by the transducer 31 may cause the stencil 10 to oscillate perpendicular to the plane of the stencil 10, as well as applying a pressure ($F_P$) to the material 13. The sound waves 32 have at least two positive influences. First, the resulting vibration helps to overcome the tact forces ($F_A$) at the interface between the stencil 10 and the material 13. Second, the downward pressure, in addition to aiding the material 13 release, helps make the top surface 18 of the resulting deposit 13 more uniform.

Alternatively, the vibrational energy may originate from a second transducer 33 that transmits vibrational energy through a mechanical coupling means 34 between the second transducer 33 and the stencil 10. The second transducer 33 preferably comprises a piezoelectric transducer. Alternatively, the second transducer 33 may include an off-balanced motor or a mass resonant transducer. The vibrational energy transferred to the stencil 10 may cause a resultant motion of the stencil 10 in a direction perpendicular to the plane of the stencil 10. The resultant motion assists in releasing the material 13 from the aperture 11, enabling the transfer of the material 13 to the target area 14 or pad 17 on the object 12.

Alternatively, other means may be utilized to create vibrational energy as described herein to enhance the release of the stencil 10 from the material 13. Other means include the use of small nozzles using compressed gas such as air, emitting short bursts or pulses of air to form waves similar to those of the preferred sound waves 32. A variation on this alternative is to use a rotating wheel comprising a series of holes, to inject gas pressure on the stencil 10 from a compressed gas source. The rotating wheel may be placed between the compressed gas source and the stencil 10, and the gas compressed gas may act on the material through the holes in the rotating wheel. Similarly, compressed gas may be injected through a fan, which fan would interrupt the flow of gas and cause a pulses to reach the stencil 10 and the material 13.

What is claimed is:

1. A method for screen printing, comprising the steps:
   aligning and securing an object,
   aligning and securing a stencil having at least one aperture proximate said object,
   applying a material proximate said stencil for placement in the at least one apetures,
   moving the material into the at least one aperture,
   applying a pressure, releasing force using vibrational energy waves in a space relation to said stencil where the vibrational energy wave are not any blasts of air, and
   separating said stencil and said object.

2. The method of claim 1, wherein the vibrational energy waves are created using a transducer.

3. The method of claim 2, wherein the transducer comprises an ultrasonic horn.

4. The method of claim 3, wherein the vibrational energy waves comprise of sound waves of small amplitude and high frequency.

5. The method of claim 1, wherein the vibrational energy waves are created using a tuning fork.

6. The method of claim 1, wherein the vibrational energy waves are created using a loudspeaker.

7. A method for screen printing printed circuit assemblies, comprising the steps of:
   aligning and securing a substrate,
   aligning and securing a stencil having at least one aperture proximate said substrate,
   filling the at least one aperture of said stencil with a material to be deposited on said substrate,
   applying a pressure, releasing force using vibrational energy waves to said stencil where a means for creating the pressure force is located in a spacial relation to said stencil and the vibrational energy waves are not any blasts of air, and
   separating said stencil and said substrate.

8. The method of claim 7, wherein the vibrational energy transfers sound pressure waves which apply a pressure to the material.

9. The method of claim 7, wherein the vibrational energy waves are created using a transducer.

10. The method of claim 7, wherein the vibrational energy waves comprise of sound waves of small amplitude and high frequency.

11. The method of claim 7, wherein the vibrational energy waves are created using a tuned fork.

12. The method of claim 7, wherein the vibrational energy waves are created using a loudspeaker.

13. An apparatus in combination with a stencil printer for improving the release of a material from a stencil, the apparatus comprising:
   means for creating a pressure force using vibrational energy waves to said stencil whereby the means for creating a pressure force is located in a spacial relation to said stencil and the vibrational energy waves are not any blasts of air.

14. The apparatus of claim 13, wherein the means for creating vibrational energy waves is a transducer.

15. The apparatus of claim 13, wherein the means for creating vibrational energy waves is an ultrasonic horn.

16. The apparatus of claim 13, wherein the means for creating vibrational energy is a tuned horn.

17. The method of claim 13, wherein the vibrational energy waves are created using a loudspeaker.

18. The apparatus of claim 13, wherein the means for creating a pressure force is capable of applying sound waves of small amplitude and high frequency.

19. The apparatus of claim 13, wherein the apparatus further comprises:
   a means for holding an object which material is to be deposited,
   a means for holding a stencil with at least one aperture,
   a means for aligning said stencil proximate said object,
   a means for filling said at least one aperture with material to be deposited on said object, and
   detachment means for separating said stencil and said object.

20. The apparatus of claim 19, wherein the means for creating vibrational energy waves is a transducer.

21. The apparatus of claim 19, wherein the means for creating vibrational energy waves is an ultrasonic horn.

22. The apparatus of claim 19, wherein the means for creating vibrational energy waves is a tuned horn.

23. The apparatus of claim 19, wherein the means for creating a pressure force is capable of applying sound waves of small amplitude and high frequency.

* * * * *